(12) United States Patent
Yamaguchi

(10) Patent No.: US 11,711,069 B2
(45) Date of Patent: Jul. 25, 2023

(54) SEMICONDUCTOR INTEGRATED CIRCUIT

(71) Applicant: SEIKO EPSON CORPORATION, Tokyo (JP)

(72) Inventor: Yoshiyuki Yamaguchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/696,146

(22) Filed: Mar. 16, 2022

(65) Prior Publication Data

US 2022/0302902 A1  Sep. 22, 2022

(30) Foreign Application Priority Data

Mar. 18, 2021 (JP) ................................ 2021-044415

(51) Int. Cl.
*H03K 3/011* (2006.01)
*H03K 3/0231* (2006.01)
*H03L 1/04* (2006.01)
*H03K 3/36* (2006.01)
*H03L 1/02* (2006.01)

(52) U.S. Cl.
CPC ............ *H03K 3/011* (2013.01); *H03K 3/0231* (2013.01); *H03K 3/36* (2013.01); *H03L 1/026* (2013.01); *H03L 1/04* (2013.01)

(58) Field of Classification Search
CPC ........ H03B 5/04; H03K 3/011; H03K 3/0231; H03L 1/02; H03L 1/022–026; H03L 1/04
See application file for complete search history.

(56) References Cited

U.S. PATENT DOCUMENTS

| | | | | | |
|---|---|---|---|---|---|
| 4,949,055 | A | * | 8/1990 | Leitl | ...................... H03L 1/025 331/158 |
| 5,659,270 | A | * | 8/1997 | Millen | ..................... H03L 1/028 331/70 |
| 2006/0192626 | A1 | * | 8/2006 | Milliren | ..................... H03L 1/04 331/158 |
| 2008/0218279 | A1 | * | 9/2008 | Keating | ..................... H03L 1/04 331/70 |
| 2013/0313332 | A1 | * | 11/2013 | Isohata | ................... H03L 1/025 331/70 |
| 2014/0091867 | A1 | * | 4/2014 | Nonoyama | ............. H03L 1/023 331/70 |
| 2014/0292423 | A1 | * | 10/2014 | Isohata | .................. H03L 1/025 331/70 |

(Continued)

FOREIGN PATENT DOCUMENTS

JP  2019-149665  9/2019

OTHER PUBLICATIONS

Irie et al., "High Stability Ultra-Miniature Size OCXO Operating within Wide Temperature Range Using ASIC with Built-in Oven for OCXO", IEEE, Oct. 29, 2020, Saitama prefecture, Japan; 4 pages.

*Primary Examiner* — Levi Gannon
(74) *Attorney, Agent, or Firm* — Rankin, Hill & Clark LLP

(57) ABSTRACT

Provided is a semiconductor integrated circuit including an oscillation circuit configured to output an oscillation signal, a heater configured to heat the oscillation circuit, a temperature sensor configured to detect a temperature of the oscillation circuit, and a nonvolatile memory configured to store temperature correction data. The oscillation circuit controls a frequency of the oscillation signal based on an output signal of the temperature sensor and the temperature correction data.

7 Claims, 6 Drawing Sheets

(56) References Cited

U.S. PATENT DOCUMENTS

| | | | |
|---|---|---|---|
| 2015/0061783 A1* | 3/2015 | Yorita | H03L 1/04 |
| | | | 331/70 |
| 2015/0180444 A1* | 6/2015 | Hayashi | H03L 1/04 |
| | | | 219/210 |
| 2016/0241189 A1* | 8/2016 | Itasaka | H03B 5/362 |
| 2016/0285463 A1* | 9/2016 | Owaki | H03L 1/022 |
| 2019/0238138 A1* | 8/2019 | Sudo | H03H 9/0514 |
| 2022/0239284 A1* | 7/2022 | Yu | H03K 3/0231 |

* cited by examiner

SEMICONDUCTOR INTEGRATED CIRCUIT

The present application is based on, and claims priority from JP Application Serial Number 2021-044415, filed Mar. 18, 2021, the disclosure of which is hereby incorporated by reference herein in its entirety.

BACKGROUND

1. Technical Field

The present disclosure relates to a semiconductor integrated circuit.

2. Related Art

JP-A-2019-149665 describes a semiconductor device that adjusts temperature characteristics of an oscillation circuit based on control data stored in a nonvolatile memory.

In general, since the temperature characteristics of the oscillation circuit change before and after an assembly step of a package due to a package stress, it is necessary to evaluate frequency temperature characteristics of an oscillation signal after assembling of the package. In the semiconductor device described in JP-A-2019-149665, it is necessary to use a device such as a thermostatic bath or a thermostreamer in order to measure a frequency of the oscillation signal at a plurality of temperatures, and reducing a cost and time required for creating the control data is difficult.

SUMMARY

A semiconductor integrated circuit according to an aspect of the present disclosure includes: an oscillation circuit configured to output an oscillation signal; a heater configured to heat the oscillation circuit; a temperature sensor configured to detect a temperature of the oscillation circuit; and a nonvolatile memory configured to store temperature correction data, in which the oscillation circuit is configured to control a frequency of the oscillation signal based on an output signal of the temperature sensor and the temperature correction data.

DESCRIPTION OF EXEMPLARY EMBODIMENTS

Hereinafter, a preferred embodiment of the present disclosure will be described in detail with reference to the drawings. The embodiment described below does not in any way limit contents of the present disclosure described in the claims. Not all configurations described below are necessarily essential components of the present disclosure.

1. Configuration of Semiconductor Integrated Circuit

Figure 1:
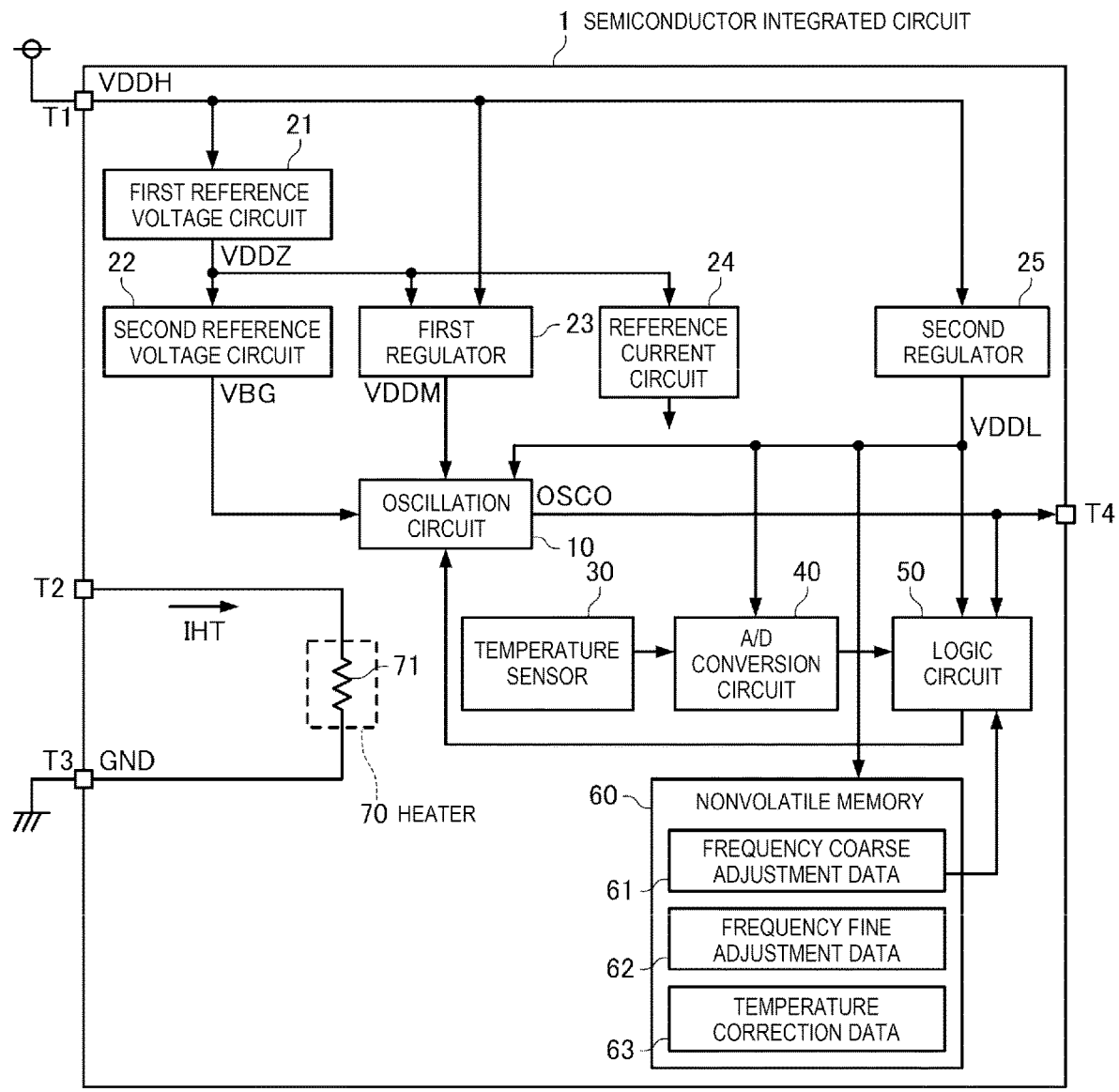
FIG. 1 is a functional block diagram of a semiconductor integrated circuit according to the present embodiment.

FIG. 1 is a functional block diagram of a semiconductor integrated circuit according to the present embodiment. As shown in FIG. 1, a semiconductor integrated circuit 1 according to the present embodiment includes external terminals T1, T2, T3, and T4, an oscillation circuit 10, a first reference voltage circuit 21, a second reference voltage circuit 22, a first regulator 23, a reference current circuit 24, a second regulator 25, a temperature sensor 30, an A/D conversion circuit 40, a logic circuit 50, a nonvolatile memory 60, and a heater 70. The semiconductor integrated circuit 1 may have a configuration in which a part of these elements are omitted or changed, or other elements are added.

The external terminals T1, T2, T3, and T4 are terminals for external coupling. The external terminal T1 is a power supply terminal, and is electrically coupled to the first reference voltage circuit 21, the first regulator 23, and the second regulator 25. The external terminal T1 is supplied with a power supply voltage VDDH. The external terminal T2 is electrically coupled to the heater 70. The external terminal T3 is a ground terminal, and is electrically coupled to the oscillation circuit 10, the first reference voltage circuit 21, the second reference voltage circuit 22, the first regulator 23, the reference current circuit 24, the second regulator 25, the temperature sensor 30, the A/D conversion circuit 40, the logic circuit 50, the nonvolatile memory 60, and the heater 70. The external terminal T3 is supplied with a ground voltage GND. The external terminal T4 is electrically coupled to the oscillation circuit 10.

The first reference voltage circuit 21 generates a first reference voltage VDDZ based on the power supply voltage VDDH. The first reference voltage VDDZ is supplied to the second reference voltage circuit 22, the first regulator 23, and the reference current circuit 24.

The second reference voltage circuit 22 generates a second reference voltage VBG based on the first reference voltage VDDZ. The second reference voltage VBG is supplied to the oscillation circuit 10.

The first regulator 23 generates a first constant voltage VDDM based on the first reference voltage VDDZ. The first constant voltage VDDM is supplied to the oscillation circuit 10.

The reference current circuit 24 generates various reference currents based on the first reference voltage VDDZ. The various reference currents generated by the reference current circuit 24 are supplied to respective circuits.

The second regulator 25 generates a second constant voltage VDDL based on the power supply voltage VDDH. The second constant voltage VDDL is supplied to the oscillation circuit 10, the A/D conversion circuit 40, the logic circuit 50, and the nonvolatile memory 60.

The oscillation circuit 10 generates and outputs an oscillation signal OSCO based on the second reference voltage VBG, the first constant voltage VDDM, and the second constant voltage VDDL. The oscillation signal OSCO is output from the external terminal T4 to an outside of the semiconductor integrated circuit 1. The oscillation signal OSCO is supplied to the logic circuit 50.

The temperature sensor 30 detects a temperature of the oscillation circuit 10 and outputs a voltage signal corresponding to the detected temperature.

The A/D conversion circuit 40 converts a signal output from the temperature sensor 30 into temperature data, which is a digital signal, by using a voltage difference between the second constant voltage VDDL and the ground voltage GND as a full scale voltage, and outputs the temperature data.

The logic circuit 50 operates by using the second constant voltage VDDL as a power supply voltage and using the oscillation signal OSCO as a clock signal, and outputs an oscillation control signal for controlling an operation of the oscillation circuit 10 and frequency control data for controlling a frequency of the oscillation signal OSCO output from the oscillation circuit 10. In the present embodiment, the oscillation control signal includes various enable signals. The frequency control data includes first frequency adjustment data, second frequency adjustment data, and frequency correction data.

The logic circuit 50 generates the first frequency adjustment data based on frequency coarse adjustment data stored in the nonvolatile memory 60. The frequency coarse adjustment data 61 is data for coarsely adjusting the frequency of the oscillation signal OSCO so as to be included in a predetermined frequency band including a target frequency among a plurality of frequency bands such as a 4 MHz band, an 8 MHz band, a 16 MHz band, and a 24 MHz band. The logic circuit 50 may output the frequency coarse adjustment data 61 as the first frequency adjustment data.

The logic circuit 50 generates the second frequency adjustment data based on frequency fine adjustment data 62 stored in the nonvolatile memory 60. The frequency fine adjustment data 62 is data for finely adjusting the frequency of the oscillation signal OSCO at a reference temperature so as to substantially coincide with the target frequency. The reference temperature is, for example, 25° C. The logic circuit 50 may output the frequency fine adjustment data 62 as the second frequency adjustment data.

The logic circuit 50 generates the frequency correction data based on an output signal of the temperature sensor 30 and temperature correction data 63 stored in the nonvolatile memory 60. The temperature correction data 63 is data for correcting the frequency of the oscillation signal OSCO so as to substantially coincide with the target frequency regardless of the temperature, and is, for example, data in which a correspondence relationship between a value of the temperature data and a value of the frequency correction data is defined. The logic circuit 50 generates, with reference to the temperature correction data 63, the frequency correction data for making the oscillation signal OSCO substantially coincide with the target frequency according to the value of the temperature data output from the A/D conversion circuit 40.

The oscillation circuit 10 controls the frequency of the oscillation signal OSCO based on the output signal of the temperature sensor 30 and the temperature correction data 63. Specifically, the oscillation circuit 10 controls the frequency of the oscillation signal OSCO based on the frequency correction data generated by the logic circuit 50 based on the temperature correction data 63 and the output signal of the temperature sensor 30. That is, the oscillation circuit 10 controls the frequency of the oscillation signal OSCO so as to coincide with the target frequency according to the frequency correction data.

The nonvolatile memory 60 may be, for example, a FAMOS, a MONOS type memory, an EEPROM, or the like. The FAMOS is an abbreviation for floating gate avalanche injection metal oxide semiconductor. The MONOS is an abbreviation for metal oxide nitride oxide silicon. The EEPROM is an abbreviation for electrically erasable programmable read-only memory. In an inspection step of the semiconductor integrated circuit 1, the frequency coarse adjustment data 61, the frequency fine adjustment data 62, and the temperature correction data 63 are stored in the nonvolatile memory 60. For example, an inspection device creates the frequency coarse adjustment data 61, the frequency fine adjustment data 62, and the temperature correction data 63, transmits the data to the logic circuit 50 via a plurality of external terminals (not shown) of the semiconductor integrated circuit 1, and the logic circuit writes the data into the nonvolatile memory 60. A procedure for creating the frequency coarse adjustment data 61, the frequency fine adjustment data 62, and the temperature correction data 63 by the inspection device will be described later. When the power supply voltage VDDH is supplied to the external terminal T1 of the semiconductor integrated circuit 1, various kinds of data stored in the nonvolatile memory 60 is transferred to a register (not shown) provided in the logic circuit 50.

In the present embodiment, the inspection step of creating the frequency coarse adjustment data 61, the frequency fine adjustment data 62, and the temperature correction data 63 and writing the data to the nonvolatile memory 60 is performed before the semiconductor integrated circuit 1 is shipped. In order to create the temperature correction data 63, it is necessary to measure the frequency of the oscillation signal OSCO at a plurality of temperatures, and the heater 70 is used to heat the oscillation circuit 10. In the present embodiment, the heater 70 is a resistance element 71 whose one end is electrically coupled to the external terminal T2 and whose the other end is electrically coupled to the external terminal T3. The resistance element 71 generates heat when a current IHT having a magnitude corresponding to a voltage supplied to the external terminal T2 flows. The resistance element 71 is an example of a first resistance element. The external terminal T2 is an example of a first terminal, and the external terminal T3 is an example of a second terminal.

The semiconductor integrated circuit 1 may be shipped by using the external terminal T3 as an N/C terminal, and after the semiconductor integrated circuit 1 is shipped, the current IHT may not flow through the heater 70. The N/C is an abbreviation for non-connection.

2. Configuration of Oscillation Circuit

Figure 2:
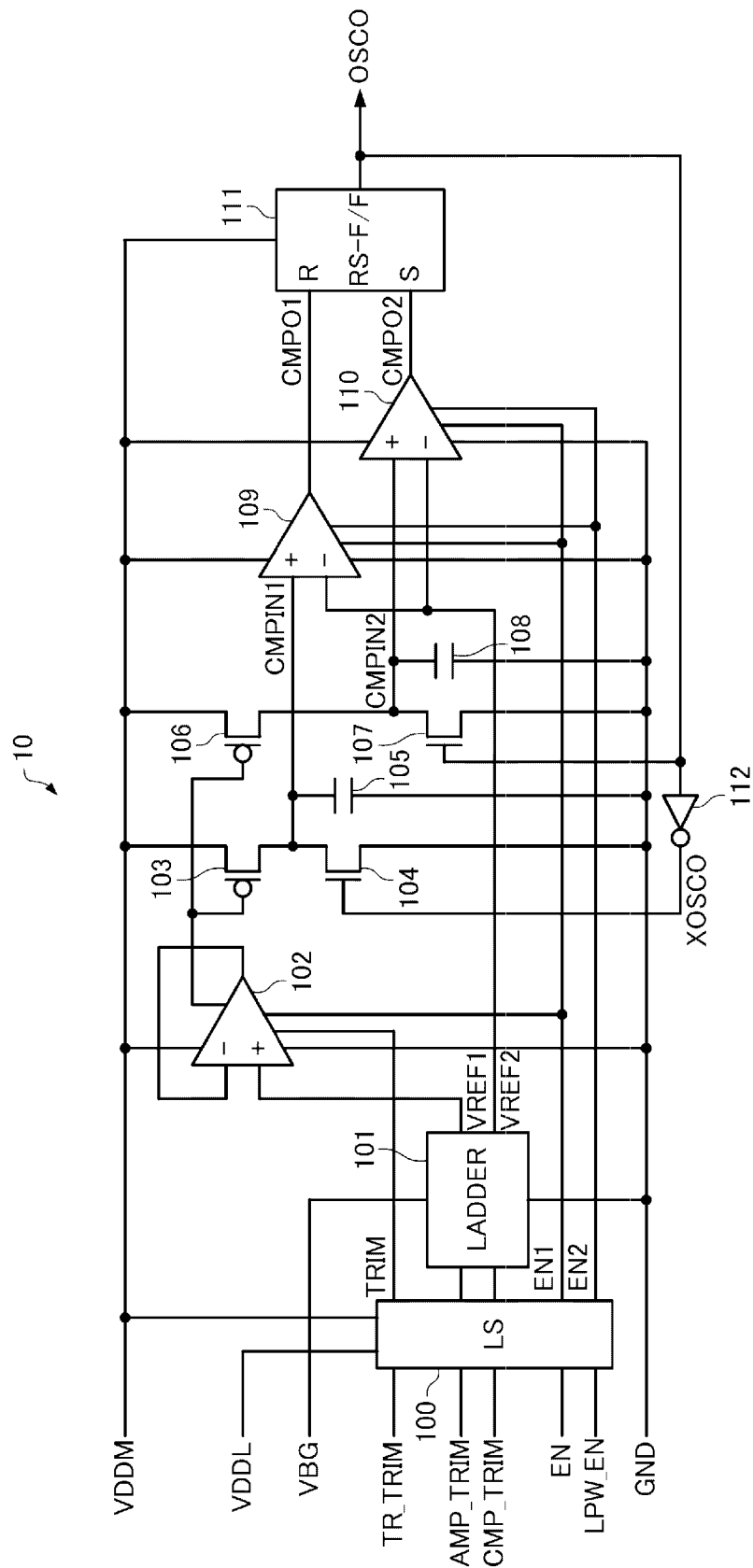
FIG. 2 is a diagram showing a configuration example of an oscillation circuit.

FIG. 2 is a diagram showing a configuration example of the oscillation circuit 10. As shown in FIG. 2, the oscillation circuit 10 includes a level shifter 100, a resistor ladder 101, an operational amplifier 102, a P-channel MOS transistor 103, an N-channel MOS transistor 104, a first capacitor 105, a P-channel MOS transistor 106, an N-channel MOS transistor 107, a second capacitor 108, a first comparator 109, a second comparator 110, an RS flip-flop 111, and a logic inversion element 112. The MOS is an abbreviation for metal oxide semiconductor.

The level shifter 100 converts first frequency adjustment data TR_TRIM in which a voltage in the vicinity of the second constant voltage VDDL is set to a high level into trimming data TRIM in which a voltage in the vicinity of the first constant voltage VDDM is set to a high level, and outputs the trimming data TRIM to the operational amplifier 102.

In addition, the level shifter 100 converts second frequency adjustment data AMP_TRIM in which the voltage in the vicinity of the second constant voltage VDDL is set to the high level and frequency correction data CMP_TRIM into data in which the voltage in the vicinity of the first constant voltage VDDM is set to the high level, and outputs the data to the resistor ladder 101.

Further, the level shifter 100 converts an enable signal EN and a low power enable signal LPW_EN, which are oscillation control signals in which the voltage in the vicinity of the second constant voltage VDDL is set to the high level, into a first enable signal EN1 and a second enable signal EN2 in which the voltage in the vicinity of the first constant voltage VDDM is set to the high level, respectively, and outputs the first enable signal EN1 and the second enable signal EN2 to the first comparator 109 and the second comparator 110.

The first frequency adjustment data TR_TRIM, the second frequency adjustment data AMP_TRIM, the frequency correction data CMP_TRIM, the enable signal EN, and the low power enable signal LPW_EN are output from the logic circuit 50 and supplied to the level shifter 100.

The resistor ladder 101 is configured by coupling a plurality of resistors in series, and outputs a first reference voltage VREF1, which is obtained by dividing a voltage between the second reference voltage VBG and the ground voltage GND by the plurality of resistors, according to a value of data in which the high level of the second frequency adjustment data AMP_TRIM is shifted by the level shifter 100. The resistor ladder 101 outputs a second reference voltage VREF2, which is obtained by dividing the voltage between the second reference voltage VBG and the ground voltage GND by the plurality of resistors, according to a value of data in which the high level of the frequency correction data CMP_TRIM is shifted by the level shifter 100.

The trimming data TRIM, the first reference voltage VREF1, and the first enable signal EN1 are input to the operational amplifier 102, and the operational amplifier 102 operates when the first enable signal EN1 is at a high level.

Figure 3:
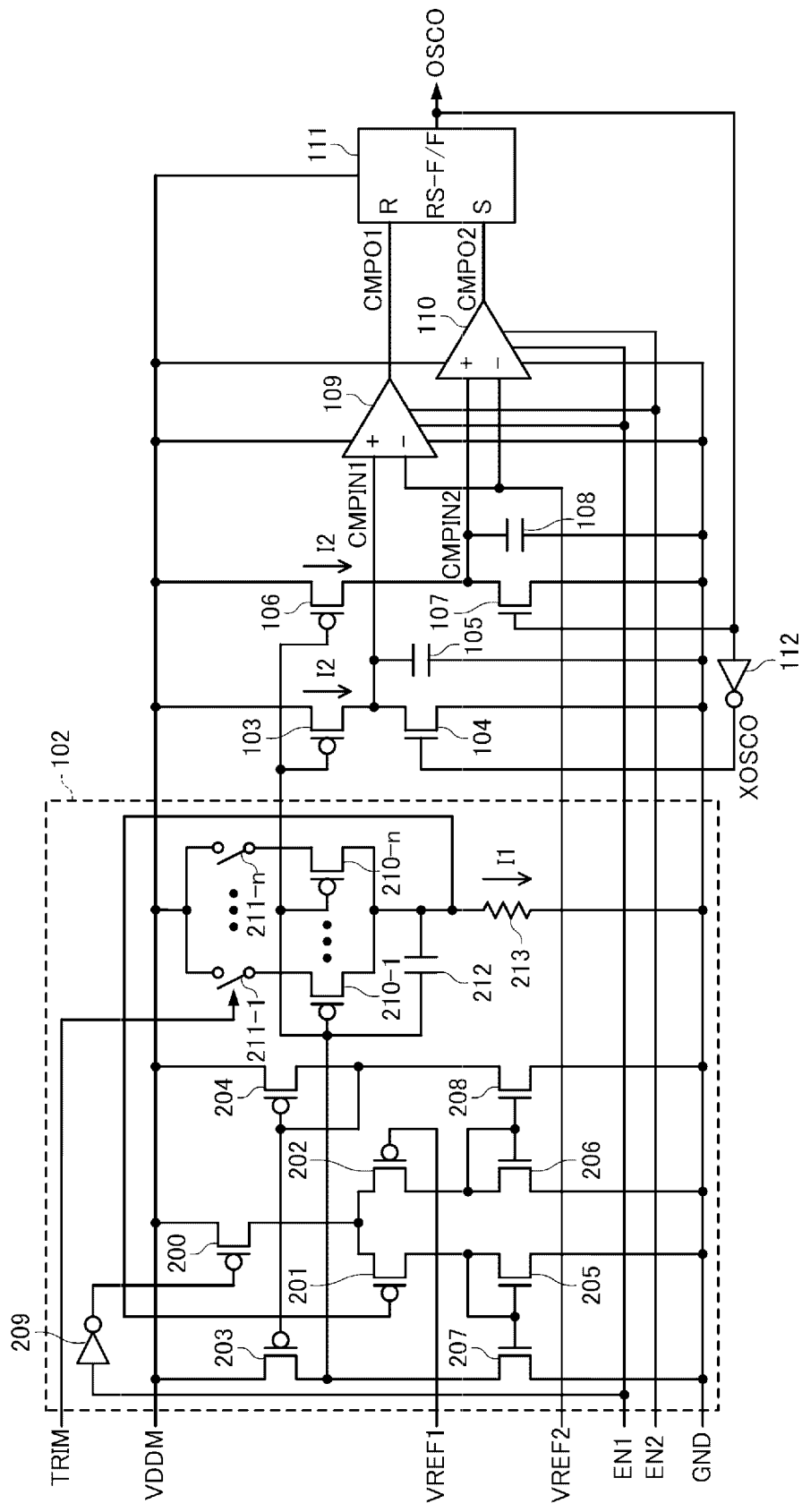
FIG. 3 is a diagram showing a configuration example of an operational amplifier.

FIG. 3 is a diagram showing a configuration example of the operational amplifier 102. For convenience of the description of the operational amplifier 102, FIG. 3 also shows the P-channel MOS transistor 103, the N-channel MOS transistor 104, the first capacitor 105, the P-channel MOS transistor 106, the N-channel MOS transistor 107, the second capacitor 108, the first comparator 109, the second comparator 110, the RS flip-flop 111, and the logic inversion element 112 shown in FIG. 2.

As shown in FIG. 3, the operational amplifier 102 includes P-channel MOS transistors 200, 201, 202, 203, and 204, N-channel MOS transistors 205, 206, 207, and 208, a logic inversion element 209, n P-channel MOS transistors 210-1 to 210-$n$, n switch elements 211-1 to 211-$n$, a capacitor 212, and a resistance element 213. n is an integer greater than or equal to 2.

The P-channel MOS transistor 200 has a gate to which an output signal of the logic inversion element 209 is input, a source to which the first constant voltage VDDM is supplied, and a drain coupled to a source of the P-channel MOS transistor 201 and a source of the P-channel MOS transistor 202. The first enable signal EN1 is input to the logic inversion element 209.

A gate of the P-channel MOS transistor 201 is coupled to each drain of the P-channel MOS transistors 210-1 to 210-$n$, one end of the capacitor 212, and one end of the resistance element 213. The other end of the capacitor 212 is coupled to a drain of the P-channel MOS transistor 203, a drain of the N-channel MOS transistor 207, and each gate of the P-channel MOS transistors 210-1 to 210-$n$, 103, and 106. The ground voltage GND is supplied to the other end of the resistance element 213.

A drain of the P-channel MOS transistor 201 is coupled to each gate of the N-channel MOS transistors 205 and 207 and a drain of the N-channel MOS transistor 205. The ground voltage GND is supplied to each source of the N-channel MOS transistors 205 and 207.

The first reference voltage VREF1 is supplied to a gate of the P-channel MOS transistor 202. A drain of the P-channel MOS transistor 202 is coupled to each gate of the N-channel MOS transistors 206 and 208 and a drain of the N-channel MOS transistor 206. The ground voltage GND is supplied to each source of the N-channel MOS transistors 206 and 208.

A gate of the P-channel MOS transistor 203 is coupled to a gate of the P-channel MOS transistor 204, a drain of the P-channel MOS transistor 204, and a drain of the N-channel MOS transistor 208. The first constant voltage VDDM is supplied to each drain of the P-channel MOS transistors 203 and 204.

Each source of the P-channel MOS transistors 210-1 to 210-$n$ is coupled to each of one ends of the switch elements 211-1 to 211-$n$. The first constant voltage VDDM is supplied to each of the other ends of the switch elements 211-1 to 211-$n$. According to a logic level of each bit of the trimming data TRIM, one of the switch elements 211-1 to 211-$n$ is conductive, and the other switch elements are non-conductive. Gate sizes W/L of the P-channel MOS transistors 210-1 to 210-$n$ are different from one another, for example, when a switch element 211-$i$ is conductive, a current I1 flows between a source and a drain of the P-channel MOS transistor 210-$i$ and through the resistance element 213.

In the operational amplifier 102 configured as such, when the first enable signal EN1 is at the high level, feedback is applied such that a voltage at the gate of the P-channel MOS transistor 202 is equal to the first reference voltage VREF1, which is a voltage at the gate of the P-channel MOS transistor 201. Therefore, the higher the first reference voltage VREF1 is, the higher a voltage applied to both ends of the resistance element 213 is, and the larger the current I1 is. That is, the current I1 having a magnitude corresponding to the first reference voltage VREF1 input to the operational amplifier 102 flows through the resistance element 213. The resistance element 213 is an example of a second resistance element.

Each gate of the P-channel MOS transistors 103 and 106 is coupled to each gate of the P-channel MOS transistors 210-1 to 210-$n$. The first constant voltage VDDM is supplied to each source of the P-channel MOS transistors 103 and 106.

A drain of the P-channel MOS transistor 103 is coupled to a drain of the N-channel MOS transistor 104, one end of the first capacitor 105, and a non-inversion input terminal of the first comparator 109. The ground voltage GND is supplied to a source of the N-channel MOS transistor 104 and the other end of the first capacitor 105. An output signal of the logic inversion element 112 is input to a gate of the N-channel MOS transistor 104.

A drain of the P-channel MOS transistor 106 is coupled to a drain of the N-channel MOS transistor 107, one end of the second capacitor 108, and a non-inversion input terminal of the second comparator 110. The ground voltage GND is supplied to a source of the N-channel MOS transistor 107 and the other end of the second capacitor 108. The oscillation signal OSCO output from the RS flip-flop 111 is input to a gate of the N-channel MOS transistor 107 and the logic inversion element 112.

The P-channel MOS transistors 103 and 106 have the same gate size, and the same current I2 flows between the source and the drain of the P-channel MOS transistor 103 and the source and the drain of the P-channel MOS transistor 106.

When a switch element 211-i is conductive according to the trimming data TRIM, a current mirror circuit is configured with the P-channel MOS transistor 210-i and the P-channel MOS transistors 103 and 106, and a ratio of the current I1 to the current I2 is equal to a ratio of the gate size of the P-channel MOS transistor 210-i to the gate size of the P-channel MOS transistors 103 and 106. Therefore, the smaller the gate size of the P-channel MOS transistor 210-I is, the larger the current I2 is.

The first comparator 109 and the second comparator 110 are supplied with the first constant voltage VDDM and the ground voltage GND, and operate when the first enable signal EN1 is at the high level by using the first constant voltage VDDM as the power supply voltage. The first comparator 109 and the second comparator 110 operate with low power when the second enable signal EN2 is at a high level. In the first comparator 109, a voltage CMPIN1 of the first capacitor 105 is input to the non-inversion input terminal, and the second reference voltage VREF2 is input to an inversion input terminal. The first comparator 109 compares the voltage CMPIN1 with the second reference voltage VREF2, and outputs a signal CMPO1 that is at a low level when the voltage CMPIN1 is lower than the second reference voltage VREF2, and that is at a high level when the voltage CMPIN1 is higher than the second reference voltage VREF2. In the second comparator 110, a voltage CMPIN2 of the second capacitor 108 is input to the non-inversion input terminal, and the second reference voltage VREF2 is input to the inversion input terminal. Then, the second comparator 110 compares the voltage CMPIN2 with the second reference voltage VREF2, and outputs a signal CMPO2 that is at a low level when the voltage CMPIN2 is lower than the second reference voltage VREF2, and that is at a high level when the voltage CMPIN2 is higher than the second reference voltage VREF2.

In the RS flip-flop 111, the signal CMPO1 output from the first comparator 109 is input to a reset input terminal, the signal CMPO2 output from the second comparator 110 is input to a set input terminal, and the RS flip-flop 111 outputs the oscillation signal OSCO. The oscillation signal OSCO output from the RS flip-flop 111 is at a low level at a rising edge at which the signal CMPO1 changes from the low level to the high level, and is at a high level at a rising edge at which the signal CMPO2 changes from the low level to the high level.

In the oscillation circuit 10 configured as in this way, the first capacitor 105 is charged by the current I2 in a first period in which the N-channel MOS transistor 104 is turned off, and is discharged in a second period in which the N-channel MOS transistor 104 is turned on. Conversely, the second capacitor 108 is charged by the current I2 in the second period in which the N-channel MOS transistor 107 is turned off, and is discharged in the first period in which the N-channel MOS transistor 107 is turned on.

In the first period, the voltage CMPIN1 rises as the first capacitor 105 is charged, and when the voltage CMPIN1 exceeds the second reference voltage VREF2, the signal CMPO1 output from the first comparator 109 changes from the low level to the high level. Accordingly, the oscillation signal OSCO changes from the high level to the low level and proceeds to the second period. That is, the first comparator 109 compares the voltage CMPIN1 with the second reference voltage VREF2 to determine the first period, and the oscillation signal OSCO is at the high level in the first period. The high level is an example of a first logic level.

In the second period, the voltage CMPIN2 rises as the second capacitor 108 is charged, and when the voltage CMPIN2 exceeds the second reference voltage VREF2, the signal CMPO2 output from the second comparator 110 changes from the low level to the high level. Accordingly, the oscillation signal OSCO changes from the low level to the high level and proceeds to the first period. That is, the second comparator 110 compares the voltage CMPIN2 with the second reference voltage VREF2 to determine the second period, and the oscillation signal OSCO is at the low level in the second period. The low level is an example of a second logic level.

Figure 4:
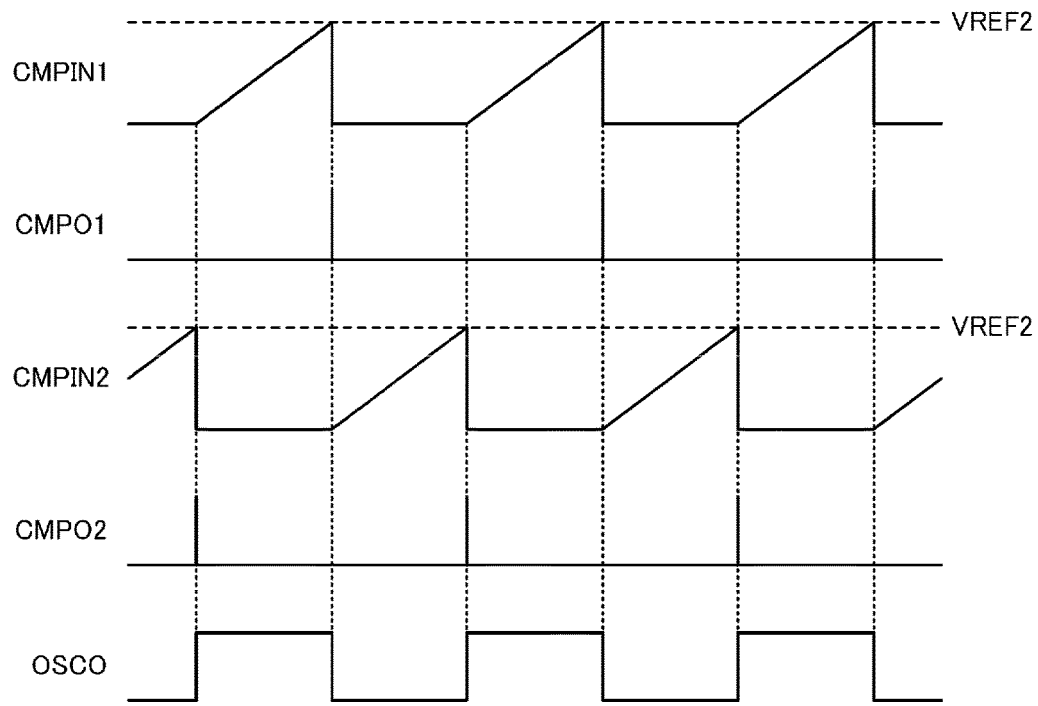
FIG. 4 is a diagram showing an example of waveforms of various signals.

FIG. 4 shows an example of waveforms of the voltages CMPIN1 and CMPIN2, the signals CMPO1 and CMPO2, and the oscillation signal OSCO.

Since a charging time of the first capacitor 105 and the second capacitor 108 changes according to a magnitude of the current I2, a rising time of the voltages CMPIN1 and CMPIN2 also changes, and the first period and the second period change. That is, the larger the current I2 is, the shorter the first period and the second period are, and the smaller the current I2 is, the longer the first period and the second period are. Therefore, the frequency of the oscillation signal OSCO can be adjusted by adjusting the current I2 by setting the first frequency adjustment data TR_TRIM and the second frequency adjustment data AMP_TRIM.

In the inspection step, by setting the frequency coarse adjustment data 61, based on which the first frequency adjustment data TR_TRIM is generated, to a desired value, the inspection device can coarsely adjust the frequency of the oscillation signal OSCO such that the frequency of the oscillation signal OSCO is included in the predetermined frequency band including the target frequency. Further, by setting the frequency fine adjustment data 62, based on which the second frequency adjustment data AMP_TRIM is generated, to a desired value, the inspection device can finely adjust the frequency of the oscillation signal OSCO so as to substantially coincide with the target frequency at the reference temperature.

A time until the logic levels of output signals of the first comparator 109 and the second comparator 110 are inverted changes according to the second reference voltage VREF2, and the first period and the second period change. That is, the first period and the second period have a length corresponding to the second reference voltage VREF2. Therefore, by changing a value of the frequency correction data CMP_TRIM according to the value of the temperature data by the logic circuit 50, the frequency of the oscillation signal OSCO can substantially coincide with the target frequency regardless of the temperature. When temperature characteristics of the resistance element 213 are dominant with respect to the temperature characteristics of the oscillation circuit 10 and a resistance value of the resistance element 213 linearly changes with respect to the temperature in a temperature range in which an operation of the semiconductor integrated circuit 1 is guaranteed, if the value of the frequency correction data CMP_TRIM is constant, the frequency of the oscillation signal OSCO linearly changes.

Therefore, in the inspection step, the inspection device can correct the frequency of the oscillation signal OSCO by creating the temperature correction data 63 such that the second reference voltage VREF2 linearly increases with respect to a temperature rise when the resistance element 213 has negative temperature characteristics, and creating the temperature correction data 63 such that the second reference voltage VREF2 linearly decreases with respect to the temperature rise when the resistance element 213 has positive temperature characteristics.

3. Layout of Semiconductor Integrated Circuit

Figure 5:
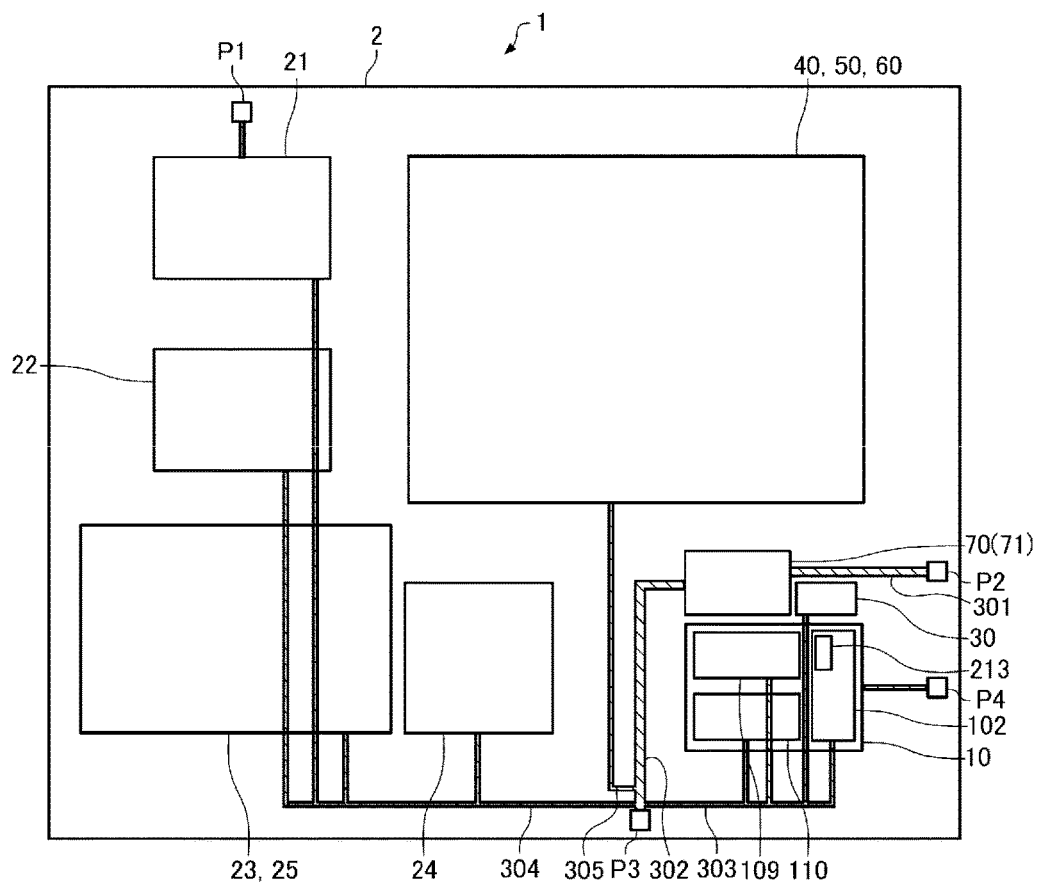
FIG. 5 is a diagram showing an arrangement example of each circuit provided in the semiconductor integrated circuit.

FIG. 5 is a diagram showing an arrangement example of each circuit provided in the semiconductor integrated circuit 1. As shown in FIG. 5, the oscillation circuit 10, the first reference voltage circuit 21, the second reference voltage circuit 22, the first regulator 23, the reference current circuit 24, the second regulator 25, the temperature sensor 30, the A/D conversion circuit 40, the logic circuit 50, the nonvolatile memory 60, and the heater 70 shown in FIG. 1 are formed in a rectangular semiconductor substrate 2 in a plan view. Four pads P1, P2, P3, and P4 are formed in an inner peripheral portion of the semiconductor substrate 2. The pads P1, P2, P3, and P4 are electrically coupled respectively, by four bonding wires (not shown), to the external terminals T1, T2, T3, and T4 of FIG. 1 provided in a package (not shown).

As shown in FIG. 5, the heater 70 and the temperature sensor 30 are disposed adjacent to the oscillation circuit 10. It is not necessary to provide another circuit between the heater 70 or the temperature sensor 30 and the oscillation circuit 10, and wirings may be provided. In this way, since the oscillation circuit 10 can be efficiently heated in the inspection step by disposing the heater 70 and the oscillation circuit 10 adjacent to each other, a time required for the inspection device to create the temperature correction data 63 can be shortened. Since a difference between the temperature detected by the temperature sensor 30 and an actual temperature of the oscillation circuit 10 is small by disposing the temperature sensor 30 and the oscillation circuit 10 adjacent to each other, a frequency deviation of the oscillation signal OSCO in the temperature range in which the operation of the semiconductor integrated circuit is guaranteed can be reduced. In particular, the temperature sensor 30 is disposed adjacent to the resistance element 213 of the operational amplifier 102. Since the temperature characteristics of the resistance element 213 are dominant with respect to the temperature characteristics of the oscillation circuit 10, the frequency deviation of the oscillation signal OSCO can be further reduced by disposing the temperature sensor 30 and the resistance element 213 adjacent to each other.

As shown in FIG. 5, a first wiring 301, a second wiring 302, a third wiring 303, a fourth wiring 304, and a fifth wiring 305 are formed on the semiconductor substrate 2. The first wiring 301 is a wiring coupling one end of the resistance element 71, which is the heater 70, and the pad P2. The second wiring 302 is a wiring coupling the other end of the resistance element 71 and the pad P3. The third wiring 303 is a wiring coupling the oscillation circuit 10 and the temperature sensor 30 with the pad P3. The fourth wiring 304 is a wiring coupling the first reference voltage circuit 21, the second reference voltage circuit 22, the first regulator 23, the reference current circuit 24, and the second regulator 25 with the pad P3. The fifth wiring 305 is a wiring coupling the A/D conversion circuit 40, the logic circuit 50, and the nonvolatile memory 60 with the pad P3. The first wiring 301 is electrically coupled to the external terminal T2 via the pad P2. The second wiring 302, the third wiring 303, the fourth wiring 304, and the fifth wiring 305 are electrically coupled to the external terminal T3 via the pad P3.

As shown in FIG. 5, widths of the first wiring 301 and the width of the second wiring 302 are wider than a width of the third wiring 303. Similarly, the widths of the first wiring 301 and the width of the second wiring 302 are wider than widths of the fourth wiring 304 and the fifth wiring 305. Therefore, in the inspection step, since the large current IHT can flow through the resistance element 71 via the first wiring 301 and the second wiring 302, which have a wider width, an amount of heat generated by the heater 70 is large, and a time for heating the oscillation circuit 10 to the vicinity of a desired temperature can be shortened.

In the example of FIG. 5, in order to shorten the first wiring 301 that couples the one end of the resistance element 71 and the pad P2 and the second wiring 302 that couples the other end of the resistance element 71 and the pad P3, the oscillation circuit 10, the heater 70, and the temperature sensor 30 are disposed at a corner of the semiconductor substrate 2, but may be disposed at another position, for example, in a central portion of the semiconductor substrate 2.

In the example of FIG. 5, the heater 70 is disposed adjacent to the oscillation circuit 10, but may not be disposed adjacent to the oscillation circuit 10. For example, the temperature sensor 30 may be disposed between the heater 70 and the oscillation circuit 10.

In the example of FIG. 5, the third wiring 303, the fourth wiring 304, and the fifth wiring 305 are coupled to a common pad P3 from the pad P3, but at least one of the third wiring 303, the fourth wiring 304, and the fifth wiring 305 may be coupled to a pad that is electrically coupled to the external terminal T3 and is different from the pad P3. For example, a pad P5 electrically coupled to the external terminal T3 may be newly provided on the semiconductor substrate 2, and the fourth wiring 304 and the fifth wiring 305 may be coupled to the pad P5.

4. Procedure for Creating Frequency Coarse Adjustment Data, Frequency Fine Adjustment Data, and Temperature Correction Data FIG. 6 is a flowchart showing an example of a procedure for creating the frequency coarse adjustment data 61, the frequency fine adjustment data 62, and the temperature correction data 63, which is performed by the inspection device in the inspection step.

Figure 6:
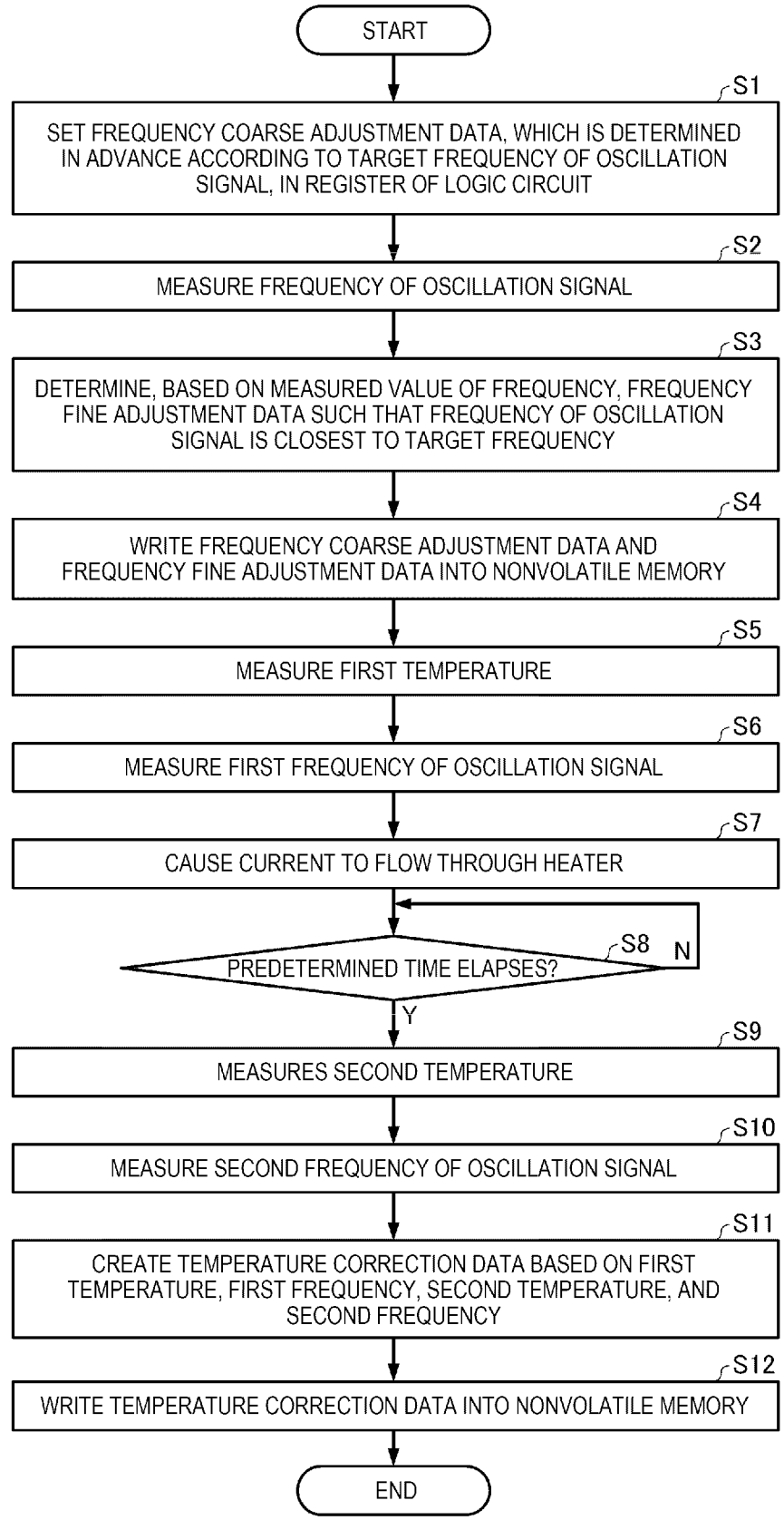
FIG. 6 is a flowchart showing an example of a procedure for creating frequency coarse adjustment data, frequency fine adjustment data, and temperature correction data.

As shown in FIG. 6, in a normal temperature environment near the reference temperature, first, in step S1, the inspection device sets the frequency coarse adjustment data 61, which is determined in advance according to the target frequency of the oscillation signal OSCO, in the register of the logic circuit 50.

Next, in step S2, the inspection device measures the frequency of the oscillation signal OSCO output from the external terminal T4.

Next, in step S3, the inspection device determines, based on a measured value of the frequency in step S2, the frequency fine adjustment data 62 such that the frequency of the oscillation signal OSCO is closest to the target frequency.

Next, in step S4, the inspection device writes the frequency coarse adjustment data 61 set in step S1 and the frequency fine adjustment data 62 determined in step S3 into the nonvolatile memory 60.

Next, in step S5, the inspection device measures a first temperature. Specifically, the output signal of the temperature sensor 30 is output from the external terminal (not shown) of the semiconductor integrated circuit 1, and the inspection device measures the first temperature based on a voltage of the output signal of the temperature sensor 30. Alternatively, the temperature data output from the A/D conversion circuit 40 is output from the external terminal (not shown) of the semiconductor integrated circuit 1, and the inspection device measures the first temperature based on the value of the temperature data.

Next, in step S6, the inspection device measures a first frequency of the oscillation signal OSCO output from the external terminal T4.

Next, in step S7, the inspection device supplies a predetermined voltage to the external terminal T2 and causes the current IHT to flow through the heater 70.

Next, in step S8, the inspection device waits until a predetermined time elapses, and when the predetermined time elapses, the inspection device measures a second temperature in step S9.

Next, in step S10, the inspection device measures a second frequency of the oscillation signal OSCO output from the external terminal T4.

Next, in step S11, the inspection device creates the temperature correction data 63 based on the first temperature measured in step S5, the first frequency measured in step S6, the second temperature measured in step S9, and the second frequency measured in step S10. Specifically, the inspection device associates the first temperature with the first frequency, associates the second temperature with the second frequency, and calculates a plurality of frequencies corresponding to a plurality of temperatures between the first temperature and the second temperature by linear interpolation using the first frequency and the second frequency. Then, the inspection device calculates the value of the temperature data for each temperature and the value of the frequency correction data CMP_TRIM for correcting each frequency to the target frequency, and creates the temperature correction data 63 in which the correspondence relationship between the value of the temperature data and the value of the frequency correction data CMP_TRIM is defined.

Finally, in step S12, the inspection device writes the temperature correction data 63 created in step S11 into the nonvolatile memory 60.

Figure 7:
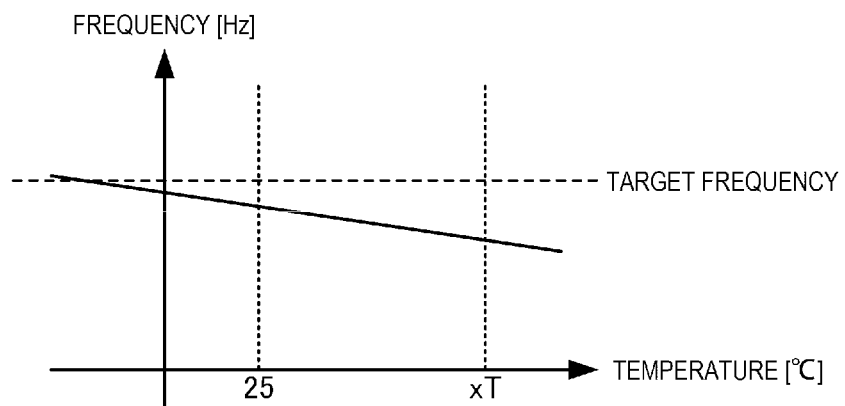
FIG. 7 is a diagram showing an example of frequency temperature characteristics of an oscillation signal at the end of step S1 of FIG. 6.
Figure 8:
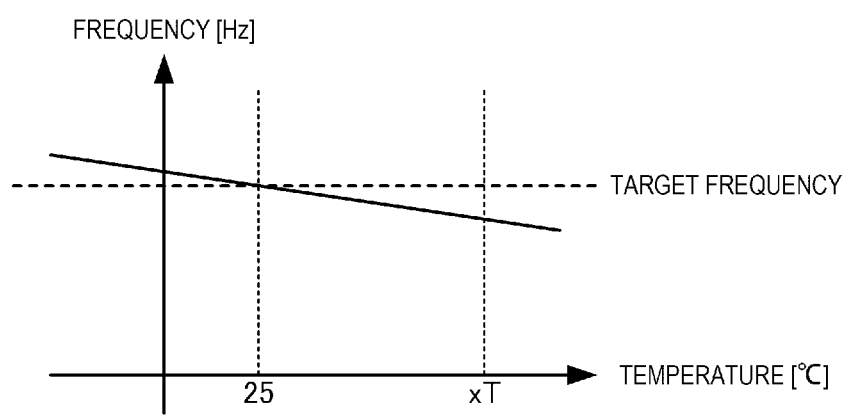
FIG. 8 is a diagram showing an example of the frequency temperature characteristics of the oscillation signal at the end of step S4 of FIG. 6.
Figure 9:
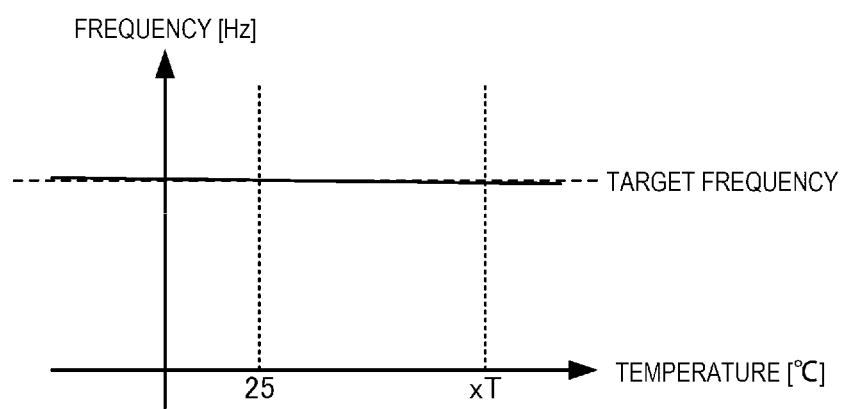
FIG. 9 is a diagram showing an example of the frequency temperature characteristics of the oscillation signal at the end of step S12 of FIG. 6.

For example, when the first temperature is 25° C. and the second temperature is xT° C., frequency temperature characteristics of the oscillation signal OSCO at the end of step S1 are as shown in FIG. 7. The frequency temperature characteristics of the oscillation signal OSCO at the end of step S4 are as shown in FIG. 8. The frequency temperature characteristics of the oscillation signal OSCO at the end of step S12 are as shown in FIG. 9. As shown in FIG. 9, according to the procedure of FIG. 6, the frequency of the oscillation signal OSCO can substantially coincide with the target frequency regardless of the temperature.

In the flowchart of FIG. 6, the temperature correction data 63 is created by measuring the frequency of the oscillation signal OSCO at two temperatures assuming that the temperature characteristics of the oscillation circuit 10 are substantially linear, but when the temperature characteristics of the oscillation circuit 10 are non-linear such as a quadratic function or a cubic function, the temperature correction data 63 may be created by measuring the frequency of the oscillation signal OSCO at three or more temperatures required for sufficiently approximating the temperature characteristics.

5. Operation and Effect

As described above, according to the semiconductor integrated circuit 1 of the present embodiment, since the oscillator circuit 10 can be heated by the built-in heater 70, the frequency temperature characteristics of the oscillation signal OSCO after assembling the package can be easily evaluated without using a device such as a thermostatic bath or a thermostreamer.

According to the semiconductor integrated circuit 1 of the present embodiment, since the oscillation circuit 10 can be efficiently heated by the heater 70 by disposing the heater 70 adjacent to the oscillation circuit 10, the oscillation circuit 10 can be changed from a normal temperature to a high temperature in an extremely short time. Therefore, in the inspection step, the inspection device can measure the frequency of the oscillation signal OSCO at a plurality of temperatures and perform the step of creating the temperature correction data 63 in a short time.

According to the semiconductor integrated circuit 1 of the present embodiment, since the difference between the temperature detected by the temperature sensor 30 and the actual temperature of the oscillation circuit 10 is small by disposing the temperature sensor 30 adjacent to the oscillation circuit 10, the frequency deviation of the oscillation signal OSCO in the temperature range in which the operation is guaranteed can be reduced.

According to the semiconductor integrated circuit 1 of the present embodiment, since the heater 70 is the resistance element 71 whose one end is electrically coupled to the external terminal T2 and whose the other end is electrically coupled to the external terminal T3, the oscillation circuit 10 can be easily heated by the current IHT flowing through the resistance element 71 via the external terminals T2 and T3 to generate heat.

According to the semiconductor integrated circuit 1 of the present embodiment, since the large current IHT can flow through the resistance element 71 via the first wiring 301 and the second wiring 302 which are wider than the third wiring 303, the fourth wiring 304, and the fifth wiring 305, the amount of the heat generated by the heater is large, and the time for heating the oscillation circuit 10 to the vicinity of the desired temperature can be shortened. Therefore, in the inspection step, the step of creating the temperature correction data 63 by the inspection device can be performed in an extremely short time.

According to the semiconductor integrated circuit 1 of the present embodiment, since the temperature sensor 30 is disposed adjacent to the resistance element 213, the difference between the temperature of the temperature sensor and the temperature of the resistance element 213 is small. Therefore, when the temperature characteristics of the resistance element 213 are dominant with respect to the temperature characteristics of the oscillation circuit 10, the frequency deviation of the oscillation signal OSCO in the temperature range in which the operation is guaranteed can be further reduced.

The present disclosure is not limited to the present embodiment, and various modifications can be made within the scope of the gist of the present disclosure.

The embodiment and the modifications described above are merely examples, and the present disclosure is not limited thereto. For example, each embodiment and each modification can be combined as appropriate.

The present disclosure includes a configuration substantially the same as the configuration described in the embodiment, for example, a configuration having the same function, method, and result, or a configuration having the same purpose and effect. The present disclosure includes a configuration obtained by replacing a non-essential portion of the configuration described in the embodiment. The present disclosure includes a configuration having the same action and effect as the configuration described in the embodiment, or a configuration capable of achieving the same purpose. The present disclosure includes a configuration in which a known technique is added to the configuration described in the embodiment.

The following contents are derived from the embodiment and modifications described above.

An aspect of the disclosure is a semiconductor integrated circuit including: an oscillation circuit configured to output an oscillation signal; a heater configured to heat the oscillation circuit; a temperature sensor configured to detect a temperature of the oscillation circuit; and a nonvolatile memory configured to store temperature correction data, in which the oscillation circuit is configured to control a frequency of the oscillation signal based on an output signal of the temperature sensor and the temperature correction data.

According to the semiconductor integrated circuit, since the oscillator circuit can be heated by the built-in heater, frequency temperature characteristics of the oscillation signal after assembling a package can be easily evaluated without using a device such as a thermostatic bath or a thermostreamer.

The semiconductor integrated circuit in the above aspect, the heater and the temperature sensor may be disposed adjacent to the oscillation circuit.

According to the semiconductor integrated circuit, since the oscillator circuit can be efficiently heated by the built-in heater, the oscillator circuit can be changed from a normal temperature to a high temperature in an extremely short time. Therefore, in an inspection step, an inspection device can measure the frequency of the oscillation signal output from the oscillation circuit at a plurality of temperatures and perform a step of creating the temperature correction data in a short time.

According to the semiconductor integrated circuit, since a difference between a temperature detected by the temperature sensor and an actual temperature of the oscillation circuit is small, a frequency deviation of the oscillation signal in a temperature range in which an operation is guaranteed can be reduced.

The semiconductor integrated circuit of the above aspect may further include: first and second terminals for external coupling, and the heater may be a first resistance element whose one end is electrically coupled to the first terminal and whose the other end is electrically coupled to the second terminal.

According to the semiconductor integrated circuit, the oscillation circuit can be easily heated by causing the heater to generate heat by using the first and second terminals for external coupling.

The semiconductor integrated circuit of the above aspect may further include: a first wiring electrically coupled to the first terminal and coupled to the one end of the first resistance element; a second wiring electrically coupled to the second terminal and coupled to the other end of the first resistance element; and a third wiring electrically coupled to the second terminal and coupled to the oscillation circuit, the second terminal may be a ground terminal, and a width of the first wiring and a width of the second wiring may be larger than a width of the third wiring.

According to the semiconductor integrated circuit, since a large current can flow through the resistance element via the first wiring and the second wiring, which have a wide width, an amount of heat generated by the heater is large, and a time for heating the oscillation circuit to the vicinity of a desired temperature can be shortened. Therefore, in the inspection step, a step of creating the temperature correction data can be performed in an extremely short time.

In the semiconductor integrated circuit of the above aspect, the oscillation circuit may include: an operational amplifier; a first capacitor to be charged in a first period having a length corresponding to a first reference voltage to be input to the operational amplifier, and to be discharged in a second period having a length corresponding to the first reference voltage; a second capacitor to be charged in the second period and to be discharged in the first period; a first comparator configured to determine the first period by comparing a voltage of the first capacitor with a second reference voltage; and a second comparator configured to determine the second period by comparing a voltage of the second capacitor with the second reference voltage, the oscillation signal may be at a first logic level in the first period, the oscillation signal may be at a second logic level in the second period, the operational amplifier may include a second resistance element through which a current having a magnitude corresponding to the first reference voltage flows, the larger the current flowing through the second resistance element is, the shorter the first period and the second period may be, and the temperature sensor may be disposed adjacent to the second resistance element.

According to the semiconductor integrated circuit, since a difference between a temperature of the temperature sensor and a temperature of the resistance element is small, when temperature characteristics of the second resistance element are dominant with respect to temperature characteristics of the oscillation circuit, the frequency deviation of the oscillation signal in the temperature range in which the operation is guaranteed can be further reduced.

The semiconductor integrated circuit of the above aspect may further include: a logic circuit configured to generate frequency correction data based on the output signal of the temperature sensor and the temperature correction data, and the oscillation circuit may be configured to control the frequency of the oscillation signal based on the frequency correction data.

What is claimed is:

1. A semiconductor integrated circuit, comprising:
an oscillation circuit configured to output an oscillation signal;
a heater configured to heat the oscillation circuit;
a temperature sensor configured to detect a temperature of the oscillation circuit;
a nonvolatile memory configured to store temperature correction data;
a first terminal for external coupling; and
a second terminal for external coupling, wherein
the oscillation circuit is configured to control a frequency of the oscillation signal based on an output signal of the temperature sensor and the temperature correction data,
the heater is a first resistance element whose one end is electrically coupled to the first terminal and whose other end is electrically coupled to the second terminal;
the semiconductor integrated circuit further comprises:
a first wiring electrically coupled to the first terminal and coupled to the one end of the first resistance element;
a second wiring electrically coupled to the second terminal and coupled to the other end of the first resistance element; and a third wiring electrically coupled to the second terminal and coupled to the oscillation circuit, and a width of the first wiring and a width of the second wiring are larger than a width of the third wiring.

2. The semiconductor integrated circuit according to claim 1, wherein
the heater and the temperature sensor are disposed adjacent to the oscillation circuit.

3. The semiconductor integrated circuit according to claim 1, further comprising:
a logic circuit configured to generate frequency correction data based on the output signal of the temperature sensor and the temperature correction data, wherein
the oscillation circuit is configured to control the frequency of the oscillation signal based on the frequency correction data.

4. The semiconductor integrated circuit according to claim 1, wherein
the second terminal is a ground terminal.

5. A semiconductor integrated circuit comprising:
an oscillation circuit configured to output an oscillation signal;
a heater configured to heat the oscillation circuit;
a temperature sensor configured to detect a temperature of the oscillation circuit; and
a nonvolatile memory configured to store temperature correction data,
wherein
the oscillation circuit is configured to control a frequency of the oscillation signal based on an output signal of the temperature sensor and the temperature correction data,
the oscillation circuit includes:
an operational amplifier;
a first capacitor to be charged in a first period having a length corresponding to a first reference voltage to be input to the operational amplifier, and to be discharged in a second period having a length corresponding to the first reference voltage;
a second capacitor to be charged in the second period and to be discharged in the first period;
a first comparator configured to determine the first period by comparing a voltage of the first capacitor with a second reference voltage; and
a second comparator configured to determine the second period by comparing a voltage of the second capacitor with the second reference voltage,
the oscillation signal is at a first logic level in the first period, and the oscillation signal is at a second logic level in the second period,
the operational amplifier includes a second resistance element through which a current having a magnitude corresponding to the first reference voltage flows,
the larger the current flowing through the second resistance element is, the shorter the first period and the second period are, and
the temperature sensor is disposed adjacent to the second resistance element.

6. The semiconductor integrated circuit according to claim 5, wherein
the heater and the temperature sensor are disposed adjacent to the oscillation circuit.

7. The semiconductor integrated circuit according to claim 5, further comprising:
a logic circuit configured to generate frequency correction data based on the output signal of the temperature sensor and the temperature correction data, wherein
the oscillation circuit is configured to control the frequency of the oscillation signal based on the frequency correction data.

* * * * *